(12) United States Patent
Chung et al.

(10) Patent No.: US 7,180,942 B2
(45) Date of Patent: Feb. 20, 2007

(54) JOINT ADAPTIVE OPTIMIZATION OF SOFT DECISION DEVICE AND FEEDBACK EQUALIZER

(75) Inventors: Wonzoo Chung, Renton, WA (US); Thomas J. Endres, Seattle, WA (US); Christopher D. Long, Maple Valley, WA (US)

(73) Assignee: Dotcast, Inc., San Francisco, CA (US)

( * ) Notice: Subject to any disclaimer, the term of this patent is extended or adjusted under 35 U.S.C. 154(b) by 677 days.

(21) Appl. No.: 10/327,280

(22) Filed: Dec. 20, 2002

(65) Prior Publication Data

US 2004/0008765 A1 Jan. 15, 2004

Related U.S. Application Data (63) Continuation-in-part of application No. 10/322,299, filed on Dec. 17, 2002.

(60) Provisional application No. 60/341,931, filed on Dec. 18, 2001.

(51) Int. Cl.
*H03H 7/30* (2006.01)
*H03H 7/40* (2006.01)
*H03K 5/159* (2006.01)

(52) U.S. Cl. ...................................... 375/233
(58) Field of Classification Search ................ 375/233, 375/350, 229, 232
See application file for complete search history.

(56) References Cited

U.S. PATENT DOCUMENTS

| | | | |
|---|---|---|---|
| 2,138,330 A | 11/1938 | Thompson | |
| 2,977,551 A | 3/1961 | Gibson et al. | |
| 3,386,033 A | 5/1968 | Copeland et al. | |
| 3,703,685 A | 11/1972 | Simopoulos et al. | |
| 3,714,659 A | 1/1973 | Firman | |
| 3,774,218 A | 11/1973 | Fowler | |
| 3,838,444 A | 9/1974 | Loughlin et al. | |
| 3,873,771 A | 3/1975 | Kleinerman et al. | |
| 3,924,060 A | 12/1975 | Bedford | |
| 3,974,449 A | 8/1976 | Falconer | |

(Continued)

FOREIGN PATENT DOCUMENTS

EP 0308241 3/1989

(Continued)

OTHER PUBLICATIONS

Ariyavisitakul et al., "Joint Coding and Decision Feedback Equalization for Broadband Wireless Channels", Dec. 1998, IEEE Journal on Selected Areas in Communications, vol. 16, No. 9, pp. 1670-1678.*

(Continued)

*Primary Examiner*—Mohammed Ghayour
*Assistant Examiner*—Aslan Ettehadieh
(74) *Attorney, Agent, or Firm*—Kilpatrick Stockton LLP (57) ABSTRACT

The present invention uses a novel adaptive soft decision device in order to jointly optimize decision device and DFE operation. The soft decision device receives the input and output samples of the slicer and generates a feedback sample by non-linearly combining them with respect to a single decision reference parameter. Moreover, the soft decision device provides novel error terms used to adapt equalizer coefficients in order to jointly optimize decision device and equalizer coefficients.

3 Claims, 7 Drawing Sheets

*Exemplary embodiment of invention, showing a self-initializing decision feedback equalizer operating at precise baseband.*

U.S. PATENT DOCUMENTS

| | | |
|---|---|---|
| 3,984,624 A | 10/1976 | Waggener |
| 3,999,005 A | 12/1976 | Dickinson |
| 4,081,497 A | 3/1978 | Tokumitsu et al. |
| 4,115,778 A | 9/1978 | Snow |
| 4,128,880 A | 12/1978 | Cray et al. |
| 4,302,626 A | 11/1981 | Streeter |
| 4,310,920 A | 1/1982 | Hayes |
| 4,316,215 A | 2/1982 | Yasumoto et al. |
| 4,322,842 A | 3/1982 | Martinez |
| 4,337,479 A | 6/1982 | Tomimoto et al. |
| 4,379,947 A | 4/1983 | Warner |
| 4,459,595 A | 7/1984 | Kramer et al. |
| 4,459,681 A | 7/1984 | Ohtsuka |
| 4,469,437 A | 9/1984 | Yuasa et al. |
| 4,476,484 A | 10/1984 | Haskell |
| 4,513,415 A | 4/1985 | Martinez |
| 4,523,225 A | 6/1985 | Masuda et al. |
| 4,535,352 A | 8/1985 | Haskell |
| 4,551,011 A | 11/1985 | Yuasa et al. |
| 4,575,225 A | 3/1986 | Yuasa et al. |
| 4,576,470 A | 3/1986 | Yuasa et al. |
| 4,587,495 A | 5/1986 | Osawa et al. |
| 4,589,011 A | 5/1986 | Rzeszewski |
| 4,602,260 A | 7/1986 | Lindenmeier |
| 4,607,230 A | 8/1986 | Kaku et al. |
| 4,754,233 A | 6/1988 | Pickett |
| 4,821,097 A | 4/1989 | Robbins |
| 4,870,489 A | 9/1989 | Ducret |
| 4,879,606 A | 11/1989 | Walter et al. |
| 4,882,614 A | 11/1989 | Kageyama et al. |
| 4,882,725 A | 11/1989 | Noda et al. |
| 4,907,218 A | 3/1990 | Inoue et al. |
| 4,926,244 A | 5/1990 | Isnardi |
| 4,928,177 A | 5/1990 | Martinez |
| 4,944,032 A | 7/1990 | Kageyama et al. |
| 4,958,230 A | 9/1990 | Jonnalagadda et al. |
| 4,985,769 A | 1/1991 | Yasumoto et al. |
| 5,006,926 A | 4/1991 | Tsinberg |
| 5,019,830 A | 5/1991 | Harada |
| 5,036,386 A | 7/1991 | Yasumoto et al. |
| 5,038,402 A | 8/1991 | Robbins |
| 5,087,975 A | 2/1992 | Citta et al. |
| 5,093,718 A | 3/1992 | Hoarty et al. |
| 5,103,295 A | 4/1992 | Uwabata et al. |
| 5,103,310 A | 4/1992 | Gibson et al. |
| 5,126,998 A | 6/1992 | Stem, Jr. |
| 5,132,988 A | 7/1992 | Fisher et al. |
| 5,134,464 A | 7/1992 | Basile et al. |
| 5,142,353 A | 8/1992 | Kageyama et al. |
| 5,151,783 A | 9/1992 | Faroudja |
| 5,172,126 A | 12/1992 | Naito |
| 5,177,604 A | 1/1993 | Martinez |
| 5,214,501 A | 5/1993 | Cavallerano et al. |
| 5,220,420 A | 6/1993 | Hoarty et al. |
| 5,235,619 A | 8/1993 | Beyers, II et al. |
| 5,243,423 A | 9/1993 | DeJean et al. |
| 5,247,351 A | 9/1993 | Cho |
| 5,270,817 A | 12/1993 | Hayashi et al. |
| 5,276,507 A | 1/1994 | Uwabata et al. |
| 5,287,180 A | 2/1994 | White |
| 5,293,633 A | 3/1994 | Robbins |
| 5,321,514 A | 6/1994 | Martinez |
| 5,327,460 A | 7/1994 | Batruni |
| 5,357,284 A | 10/1994 | Todd |
| 5,379,324 A | 1/1995 | Mueller et al. |
| 5,386,239 A | 1/1995 | Wang et al. |
| 5,430,661 A | 7/1995 | Fisher et al. |
| 5,442,403 A | 8/1995 | Yasumoto et al. |
| 5,448,299 A | 9/1995 | Yang et al. |
| 5,461,426 A | 10/1995 | Limberg et al. |
| 5,534,933 A | 7/1996 | Yang |
| 5,550,578 A | 8/1996 | Hoarty et al. |
| 5,550,579 A | 8/1996 | Martinez |
| 5,557,316 A | 9/1996 | Hoarty et al. |
| 5,559,559 A | 9/1996 | Jungo et al. |
| 5,563,664 A | 10/1996 | Yang et al. |
| 5,579,055 A | 11/1996 | Hamilton et al. |
| 5,585,975 A | 12/1996 | Bliss |
| 5,586,121 A | 12/1996 | Moura et al. |
| 5,587,743 A | 12/1996 | Montgomery et al. |
| 5,589,872 A | 12/1996 | Martinez |
| 5,596,361 A | 1/1997 | Martinez |
| 5,600,573 A | 2/1997 | Hendricks et al. |
| 5,617,148 A | 4/1997 | Montgomery |
| 5,666,168 A | 9/1997 | Montgomery et al. |
| 5,694,424 A | 12/1997 | Ariyavisitakul |
| 5,714,965 A | 2/1998 | Taguchi |
| 5,734,853 A | 3/1998 | Hendricks et al. |
| RE35,774 E | 4/1998 | Moura et al. |
| 5,742,902 A | 4/1998 | Shore |
| 5,809,086 A | 9/1998 | Ariyavisitakul |
| 5,812,184 A | 9/1998 | Martinez |
| 5,818,441 A | 10/1998 | Throckmorton et al. |
| 5,818,845 A | 10/1998 | Moura et al. |
| 5,828,655 A | 10/1998 | Moura et al. |
| 5,859,852 A | 1/1999 | Moura et al. |
| 5,881,302 A | 3/1999 | Omata |
| 5,909,253 A | 6/1999 | Jonnalagadda et al. |
| 5,946,047 A | 8/1999 | Levan |
| 5,946,048 A | 8/1999 | Levan |
| 5,946,322 A | 8/1999 | Moura et al. |
| 5,946,351 A | 8/1999 | Ariyavisitakul et al. |
| 5,956,346 A | 9/1999 | Levan |
| 5,959,660 A | 9/1999 | Levan |
| 5,959,997 A | 9/1999 | Moura et al. |
| 5,994,891 A | 11/1999 | Hubbell |
| 6,005,850 A | 12/1999 | Moura et al. |
| 6,012,161 A | 1/2000 | Ariyavisitakul et al. |
| 6,016,316 A | 1/2000 | Moura et al. |
| 6,018,526 A | 1/2000 | Liu et al. |
| 6,018,764 A | 1/2000 | Field et al. |
| 6,034,678 A | 3/2000 | Hoarty et al. |
| 6,047,159 A | 3/2000 | Powell et al. |
| 6,066,993 A | 5/2000 | Yamamoto et al. |
| 6,073,030 A | 6/2000 | Nair et al. |
| 6,100,883 A | 8/2000 | Hoarty |
| 6,104,727 A | 8/2000 | Moura et al. |
| 6,192,384 B1 | 2/2001 | Dally et al. |
| 6,201,536 B1 | 3/2001 | Hendricks et al. |
| 6,226,323 B1 | 5/2001 | Tan et al. |
| 6,240,133 B1 | 5/2001 | Sommer et al. |
| 6,268,774 B1 | 7/2001 | Soumyanath |
| 6,305,020 B1 | 10/2001 | Hoarty et al. |
| 6,310,548 B1 | 10/2001 | Stephens, Jr. et al. |
| 6,314,134 B1 | 11/2001 | Werner et al. |
| 6,356,586 B1 | 3/2002 | Krishnamoorthy et al. |
| 6,366,613 B2 | 4/2002 | Sommer et al. |
| 6,370,571 B1 | 4/2002 | Medin, Jr. |
| 6,377,529 B1 | 4/2002 | Lee et al. |
| 6,385,237 B1 | 5/2002 | Tsui et al. |
| 6,426,973 B1 | 7/2002 | Madhow et al. |
| 6,433,835 B1 | 8/2002 | Hartson et al. |
| 6,510,553 B1 | 1/2003 | Hazra |
| 6,680,971 B1 | 1/2004 | Tazebay et al. |
| 6,754,277 B1 | 6/2004 | Heinzelman et al. |
| 6,754,715 B1 | 6/2004 | Cannon et al. |
| 6,829,298 B1 * | 12/2004 | Abe et al. .................. 375/233 |
| 6,834,039 B1 | 12/2004 | Kelly et al. |
| 2001/0022813 A1 | 9/2001 | Tan et al. |
| 2002/0056140 A1 | 5/2002 | Oishi et al. |
| 2002/0059597 A1 | 5/2002 | Kikinis et al. |
| 2002/0104083 A1 | 8/2002 | Hendricks et al. |
| 2002/0186764 A1 | 12/2002 | Amin et al. |
| 2003/0095590 A1 | 5/2003 | Fuller et al. |

2003/0156603 A1  8/2003  Rakib et al.

FOREIGN PATENT DOCUMENTS

| EP | 0577351 | 1/1994 |
|---|---|---|
| EP | 1 156634 | 11/2001 |
| WO | WO 92/22983 | 12/1992 |
| WO | WO 94/23470 | 10/1994 |
| WO | WO 95/01676 | 1/1995 |
| WO | WO 99/55087 | 10/1999 |
| WO | WO 02/07425 | 1/2002 |
| WO | WO02084965 A1 | 10/2002 |

OTHER PUBLICATIONS

Lucky, R.W.: "Techniques for adaptive equalization of digital communication systems" *Bell Systems Technical Journal*, vol. 45, No. 2, pp. 255-286, Feb. 1966.

Godard, D. N.: "Self-recovering equalization and carrier tracking in two-dimensional data communication systems," *IEEE Transactions on Communications*, vol. 28, No. 11, pp. 1867-1875, Nov. 1980.

Treichler, J. R., and Agee, B.G.: "A new approach to multipath correction of constant modulus signals," *IEEE Transactions on Acoustics, Speech, and Signal Processing*, vol. ASSP-31, No. 2, pp. 459-472, Apr. 1983.

Casas R. A., et al.: "*Current approaches to blind decision feedback equalization,*" in the textbook, "*Signal processing advances in wireless and mobile communications: trends in channel estimation and equalization,*" edited by G. Giannakis, et al., Prentice Hall, Upper Saddle River, NJ, 2000.

Daneshard, B. et al. "Finite Wordlength Requirements for Adaptive Signal Processing Elements in Digital QAM ADSL Systems." Communications, 1994. Supercomm/ICC '94, Conference Record, 'Serving Humanity Through Communications,' May 1, 1994. ISBN: 0780318250.

Naito, T. et al. Adaptive Equalization Based on Internal Model Principle for Time-Varying Fading Channels. IEEE, Oct. 1, 2001, p. 363-368, XP010521667.

Evans, G: More Tools of the Trade: Modulators, Inside Custom A/V, http://www.hometeam.com/beta/0009customav.shtml.

NetMedia: MM73/NMOD3 Triple Play Modulator Installation Manual. Net Media, Tuson, AZ (undated).

Ciciora, Dukes, Hartson, Hoarty, *Embedding high-speed data in analog signals* CED Magazine, Dec. 2001, p. 92-100.

Modern Cable Television Technology: Video, Voice, and Data Communications, 1999 Walter Ciciora, James Farmer, David Large, Morgan Kaufman ISBN 1-55860-416-2.

Ormiston, et al "Compact Low Noise Receiving Antenna" IEE Electronics Letters, Jul. 9, 1998, vol. 34, No. 14, pp. 1367-1368.

Tooley et al.; "Active Receiving Antenna", Practical Wireless, Mar. 1981, vol. 57, No. 3, pp. 52-55.

Chen, Brian. *The Key to Unlocking Network Assets: Increasing Capacity by Embedding Content in Current Video Transmissions.* CED Magazine, Dec. 2001. http://www.cedmagazine.com/ced/2001/1201/12f.htm.

Press Release of WavePhore, Inc. entitled "WavePhore and the Canadian Broadcasting Corporation Enter an Agreement to Deliver Data Broadcasting Nationwide in Canada," dated Mar. 29, 1995.

Advertisement in *Investor's Business Daily*, " Technology Offers TV Broadcasters An Avenue Into Interactive Services", Monday, Apr. 19, 1993.

News Release of WavePhore, entitled "WavePhore and Belcom Sign Agreement to Co-Develop Russian Data Broadcasting System" (two pages, believed to have been released Apr. 10, 1995).

Press Release of WavePhore entitled FCC Proposed to Allow Digital Data Transmission Within the Video Portion of TV Broadcasts, in Response to WavePhore's Request, (two pages, believed to have been released Apr. 25, 1995).

Advertisement in *The Indianapolis News*, WavePhore Stock Is On Roll, dated May 23, 1995.

Advertisement in *Investor's Business Daily*, Intel, WavePhore Set Technology Alliance, dated Monday, May 8, 1995.

Press Release, entitled Intel and WavePhore Sign Technology And Investment Agreement, (two pages, believed to have been released May 5, 1995).

Advertisement, *The Arizona Republic Business*, "Tempe firm, Intel Team Up to Send Data via TV", dated Saturday, May 6, 1995.

Advertisement, *Arizona Business Gazette*, entitled "Skyway System Rides TV Signals to Distribute Data—Speed Key to WavePhore Technology", dated Jul. 13, 1995.

Advertisement, *Arizona Business Gazette*, entitled "Motivated CEO Leads WavePhore", dated Jul. 13, 1995.

Press Release of WavePhore, entitled WavePhore Develops Data Casting System for Television Azteca in Mexico (two pages, believed to have been released Aug. 8, 1995).

Press Release of WavePhore, entitled WavePhore and Arizona State University Launch Distance Learning Service, (two pages, believed to have been released Aug. 17, 1995).

"Digital Data Transmission Within the Video Portion of Television Broadcast Station Transmissions".

G.M. Glasford, *Fundamentals of Television Engineering*, McGraw-Hill 1955.

D.G. Fink, *Television Engineering*, 2nd Edition, McGraw-Hill 1952.

C.G. Eilers, "TV Mutichannel Sound—The BTSC System," IEEE Transactions on Consumer electronics, Aug. 1984.

Taylor, "The Vestigal Sideband and Other Tribulations," p. 203 of the 1988 National Cable Television Association Technical Papers.

"HDTV & Vestigal Sidebank Syndrome" in the IEEE Transactions on Broadcasting, Mar. 1990, p. 8.

Wave Generation & Shaping, Leonard Strauss, McGraw-Hill 1970, Chapters 1 and 2.

W. Ciclora et al., "A Tutorial on Ghost Canceling in Television Systems," IEEE Transactions on Consumer Electronics, vol. CE-25, No. 1, Feb. 1979, pp. 9-44.

V. Thomas Rhyne, Fundamentals of Digital System Design.

Hill, et al.—Introduction to Switching Theory & Logical Design, John Wiley & Sons 1968, SBN 471 39880 K.

Tanenbaum, A. "Computer Networks," Prentice Hall 1996, ISBN 0-1-349945-6.

Spohn, D.L., "Data Network Design," McGraw Hill, 1993 ISBN 0-07-06-360-X.

Nordholt, et al.: "A New Approach to Active Antenna Design", IEEE Transactions on Ant. And Prop., Nov. 1980, vol. AP-28, No. 6.

Kaufman, C., "Network Security," Prentice Hall, 1995 ISBN 0-13-061466-1.

Ariyavisitakul et al. "Joint Coding and Decision Feedback Equalization for Broadband Wireless Channels" IEEE; Dec. 1998; pp. 1670-1678; vol. 19; No. 9.

* cited by examiner

Figure 1: Typical prior-art communication system that may be employed for transmission of digital signals.

Figure 2: Exemplary embodiment of invention, showing a self-initializing decision feedback equalizer operating at precise baseband.

Figure 3: Block Diagram of Soft Decision Device

Figure 4: 16-QAM constellation and selection region for Soft Decision Device

Figure 5b: Soft decision device parameter

Figure 5a: Real part of equalizer output

Figure 5c: Soft Decision Device

Figure 6: Alternative embodiment of invention showing equalizer forward and feedback filters operating on passband samples.

Figure 7: Alternative embodiment of invention showing forward filter operating on passband samples, and feedback filter operating on baseband samples.

JOINT ADAPTIVE OPTIMIZATION OF SOFT DECISION DEVICE AND FEEDBACK EQUALIZER

CONTINUATION IN PART

This is a continuation-in-part of that certain U.S. Ser. No. 10/322,299, filed Dec. 17, 2002, entitled "Self-Initializing Decision Feedback Equalizer With Automatic Gain Control;" Endres, Long, Cunningham and Ray, inventors, which relies on U.S. Ser. No. 60/341,931, filed Dec. 18, 2001 entitled "Self-Initializing Decision Feedback Equalizer With Automatic Gain Control." These documents are incorporated herein by this reference.

FIELD OF INVENTION

The present invention relates to adaptive optimization techniques for Decision Feedback Equalizers in order to compensate for distortions introduced in digital communications systems using modulation techniques such as Quadrature Amplitude Modulation (QAM) or Pulse Amplitude Modulation (PAM).

BACKGROUND

In digital communication systems, the digital information bits are mapped to symbols drawn from a finite set of discrete real or complex numbers. These symbols are used to modulate a radio frequency (RF) carrier's frequency, amplitude and/or phase. For example, a quadrature oscillator can be used to modulate the complex symbols onto the amplitude and phase of the RF carrier, and the signaling is referred to as Quadrature Amplitude Modulation (QAM). The time interval between symbols is referred to as the symbol or baud interval, and the inverse of this interval is referred to as the symbol or baud rate.

Most modem digital communication systems use a symbol rate that sends thousands or millions of symbols per second, over propagation media including satellite links through the earth's atmosphere, terrestrial links from towers to fixed or mobile land-based receivers, or wired links using ancient twisted-pair copper connections or more sophisticated fiber optic connections. Such media are dispersive, causing fading and reflections that result in multiple path delays arriving at the receiver. Such behavior is known as multipath, and causes symbols to smear across multiple symbol boundaries, which is referred to as inter-symbol interference (ISI). Moreover, mismatches in transmitter and receiver filtering induce ISI. Noise is added to the received signal from transmitter and receiver component imperfections, and from sources through the propagation path. At the receiver, an equalizer is used to mitigate the effects of ISI and noise induced in the entire channel, including transmitter, propagation medium, and front-end receiver processing. Since the exact channel characteristics are not known apriori at the receiver, the equalizer is usually implemented with adaptive methods.

A common type of equalizer uses adaptive filters, and the adjustment of filter coefficients can be done in a variety of ways. Trained equalization methods rely on the embedding of a pre-determined sequence in the transmitted data, referred to as a training or reference sequence. The receiver stores or generates a replica of the training sequence, and to the extent that the received sequence differs from the training sequence, an error measure is derived to adjust equalizer coefficients. Usually, equalizer coefficient convergence relies on multiple transmissions of the training sequence, and the channel characteristics are also time varying. Hence, periodic re-training is necessary.

A common method of trained coefficient adaptation uses the Least Mean Squares (LMS) algorithm, which minimizes a Mean Squared Error (MSE) cost function with a stochastic gradient descent update rule as described in a paper entitled "The complex LMS algorithm," by Widrow, McCool, and Ball, in *The Proceedings of the IEEE*, vol. 63, no. 4, pp. 719–720, April 1975.

Unfortunately, the training sequence needed for LMS takes up valuable bandwidth that could be used for data transmissions. Hence, methods that do not rely on a reference signal, or derive a reference signal from the data itself, are desirable. Such methods are referred to as blind equalization methods. A common blind equalization method replaces the reference signal in the LMS algorithm with the receiver's best guess at the data, and is therefore referred to as Decision Directed LMS (DD-LMS), as proposed in a paper entitled "Techniques for adaptive equalization of digital communication systems," by R. W. Lucky, in the *Bell Systems Technical Journal*, vol. 45, no. 2, pp. 255–286, February 1966. Unfortunately, DD-LMS needs a reasonably low percentage of incorrect decisions to prevent algorithm divergence, and is therefore impractical from a cold-start initialization. Other blind algorithms are usually used from a cold-start.

The Constant Modulus Algorithm (CMA), proposed independently by Godard and Treichler ("Self-recovering equalization and carrier tracking in two-dimensional data communication systems," by. D. N. Godard, in *IEEE Transactions on Communications*, vol. 28, no. 11, pp. 1867–1875, October 1980, and "A new approach to multipath correction of constant modulus signals," by J. R. Treichler, and B. G. Agee, in *IEEE Transactions on Acoustics, Speech, and Signal Processing*, vol. ASSP-31, no. 2, pp. 459–472, April 1983) has rapidly become the most popular blind equalization algorithm in practice, and is well-studied in the archival literature, due to its robustness to realistic signaling environments and LMS-like computational complexity and asymptotic performance. Instead of minimizing a MSE cost function, CMA minimizes a quartic Constant Modulus (CM) cost function that penalizes dispersion at the equalizer output.

Though both LMS and CMA were originally introduced using a linear transversal, or finite impulse response (FIR) equalizer structure, a Decision Feedback Equalizer (DFE) is generally believed to provide superior ISI cancellation with less noise gain than an FIR equalizer structure. A DFE acts to additively cancel ISI by subtracting filtered decisions (or best guesses, also known as hard decisions) from the sampled received signals. The feedback structure embeds a FIR filter in a feedback loop, fed by symbol estimates, and therefore has infinite impulse response (IIR). Like the DD-LMS algortihm, the DFE architecture requires a low percentage of incorrect decisions to prevent algorithm divergence and error propagation, a phenomenon whereby an incorrect decision causes more incorrect decisions due to the recursive structure of the DFE. Therefore, a DFE requires alternative adaptive strategies from a cold-start. Several techniques based on adaptive IIR filtering have been proposed as summarized in a chapter entitled "Current approaches to blind decision feedback equalization," by R. A. Casas et al., in the textbook, "Signal processing advances in wireless and mobile communications: trends in channel estimation and equalization," edited by G. Giannakis, et al., Prentice Hall, Upper Saddle River, N.J., 2000.

Though adaptive IIR filtering approach for blind DFE initialization can achieve successful cold start up, its performance is significantly less optimal than DD-LMS/DFE and mechanical switch from IIR adaptation to DD-LMS adaptation usually exhibits performance degradation in transient period, and thus, in dealing with time varying channels. In order to achieve better transition between IIR adaptation and DD-LMS/DFE Endres et. al in Provisional Application No. 60/341,931, filed Dec. 17, 2001 entitled "Self-initializing decision feedback equalizer with automatic gain control" proposed linearly combining IIR adaptation and DD-LMS adaptation of the DFE coefficients.

On the other hand, it has been recognized that DFE is not robust under severe noise environment due to error propagation rooted in its recursive structure. Recent studies such as in "Joint Coding and Decision Feedback Equalization for Broadband Wireless Channels," by Ariyavisitakul et at in *IEEE Journals on Selected Areas in Comm.* Vol. 16, No. 9, December 1998 proposed a soft decision device approach to reduce MSE of DFE output by replacing the hard decisions with cleverly estimated soft decisions.

The present invention combines the soft decision device approach and the seamless transition between IIR adaptation and DD-LMS adaptation. Unlike the linear combination of IIR and DD-LMS adaptations, this present invention uses a family of non-linear soft decision devices approximating the optimal soft decision device studied in soft-decision DFE literatures. According to the selection rule inferred from the non-linear soft decision device, DFE coefficients are updated by selected error signals between IIR adaptation and DD-LMS adaptation on a symbol-by-symbol basis, which jointly optimizes the soft decision device and DFE adaptation.

SUMMARY

In accordance with the present invention, a Decision Feedback Equalizer (DFE) uses input samples to the feedback filter that are generated from a novel adaptive soft decision device. The soft decision device receives the input and output samples of the slicer and generates a feedback sample based on a novel non-linear decision rule. Moreover, the soft decision device provides novel error terms used to adapt equalizer coefficients.

BRIEF DESCRIPTION OF DRAWINGS

Other aspects, features, and advantages of the present invention will become more fully apparent from the following detailed description, the appended claims, and the accompanying drawings in which:

DETAILED DESCRIPTION

Figure 1:
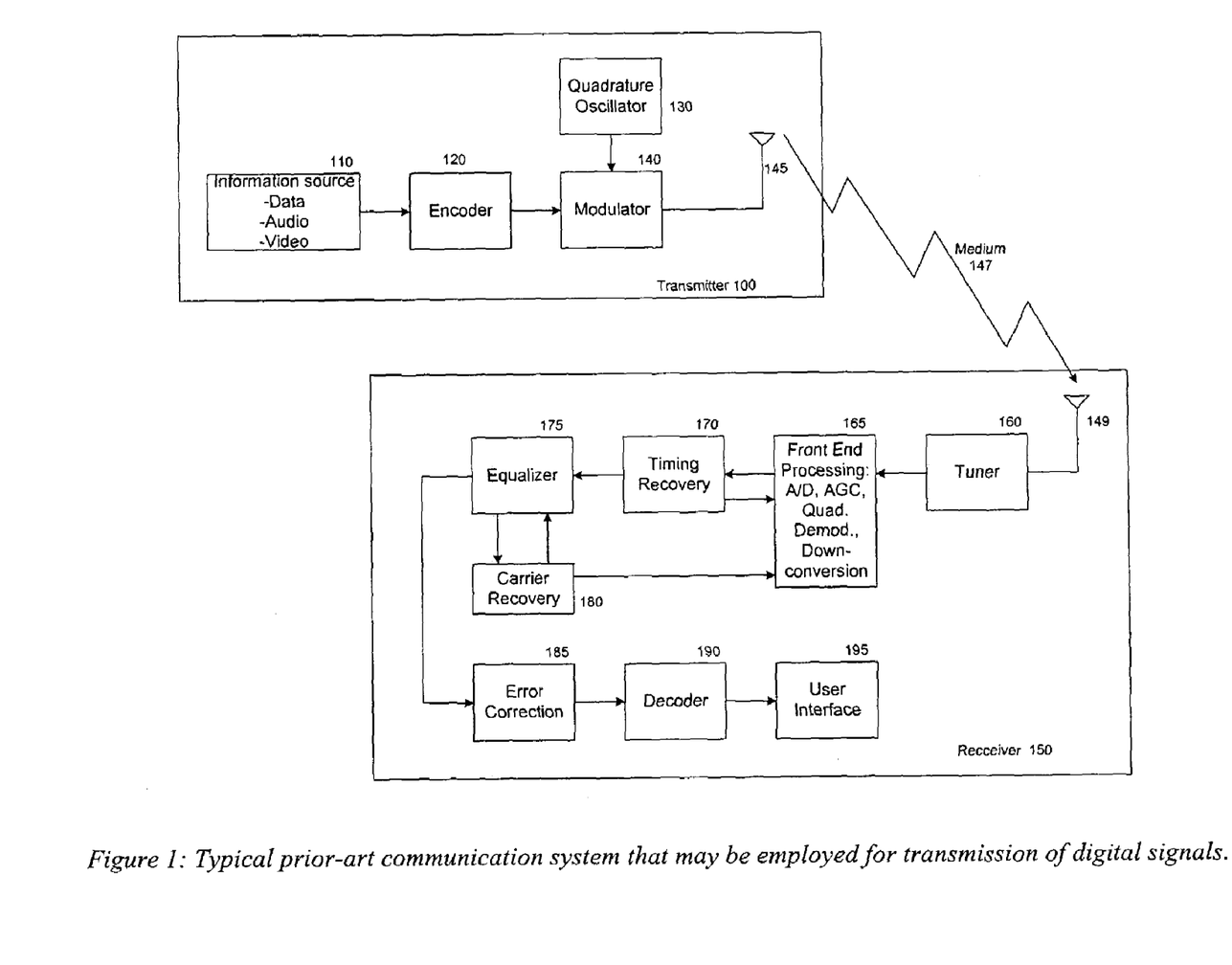
FIG. 1 shows a typical prior art communication system that may be employed for transmission of digital signals.

FIG. 1 depicts a typical prior art digital communication system. Transmitter station 100 is coupled to receiver 150 by propagation medium 147. The propagation medium could be a cable, telephone twisted-pair wire, satellite link, terrestrial link, or fiber optic connection, for example. Transmitter station 100 includes an information source 110, that contains the content such as data, audio, or video, which is to be communicated to the receiver 150. The information source 110 is coupled to encoder 120, which formats the information in a manner suitable for digital communication, typically in accordance with a given standard or protocol. The encoder 120 is coupled to modulator 140, which is also coupled to a quadrature oscillator 130. The modulator 140 uses the signal from the quadrature oscillator 130 to modulate the encoded information provided by encoder 120 onto a suitable Radio Frequency (RF) carrier frequency in amplitude and phase. The modulated signal from modulator 140 is coupled to transmit antenna 145 for transmission into propagation medium 147.

The receiver 150 receives the RF signal from propagation medium 147 via receiver antenna 149. Receiver antenna 149 is coupled to tuner 160. Tuner 160 is set to receive the RF signal in the desired frequency range, while rejecting signals in nearby or adjacent frequency ranges. Tuner 160 may provide automatic gain control at the RF frequency and also downconvert the received signal to an intermediate frequency (IF) before passing the signal to the Front End Processing block 165. Front End Processing block 165 samples the signal with an analog-to-digital converter and contains an automatic gain control circuit that scales the signal to the proper dynamic range in accordance with the analog-to-digital converter. Front End Processing block 165 may further include a digital downconversion in frequency, and performs a quadrature demodulation to split the signal into in-phase (I) and quadrature-phase (Q) samples. Front End Processing block 165 is coupled to Timing Recovery module 170 that determines a correct sampling phase. Timing Recovery module 170 may adjust the sampling phase by interpolating the data samples, or adjusting the phase and sampling frequency of the analog-to-digital converter in Front End Processing block 165. Timing Recovery module 170 is coupled to Equalizer 175, which is used to mitigate the distortions, such as inter-symbol interference and noise, that are introduced by the propagation medium 147, transmitter 100, receiver Tuner 160, receiver Front End Processing block 165, and receiver Timing Recovery module 170. Equalizer 175 is coupled to Carrier Recovery module 180, which detects residual offset in frequency and phase. The detected carrier offset in Carrier Recovery module may be supplied back to the Equalizer 175 for translation of equalized samples to precise baseband, or used to adjust the downconversion process in Front End Processing block 165, or both. The output of Equalizer 175 is coupled to Error Correction module 185, which detects and corrects bit errors in the recovered bit stream. The Error Correction module 185 is coupled to Decoder 190, which decodes the bit stream in accordance with the standard or protocol used in the Encoder 120 of Transmitter 100. The decoded bits from Decoder 190 represent the recovered information source, consisting of data, audio, or video, and are supplied to a user interface 195. The present invention is embodied in the Equalizer 175 portion of the communication system.

Baseband/Baseband Equalization

Figure 2:
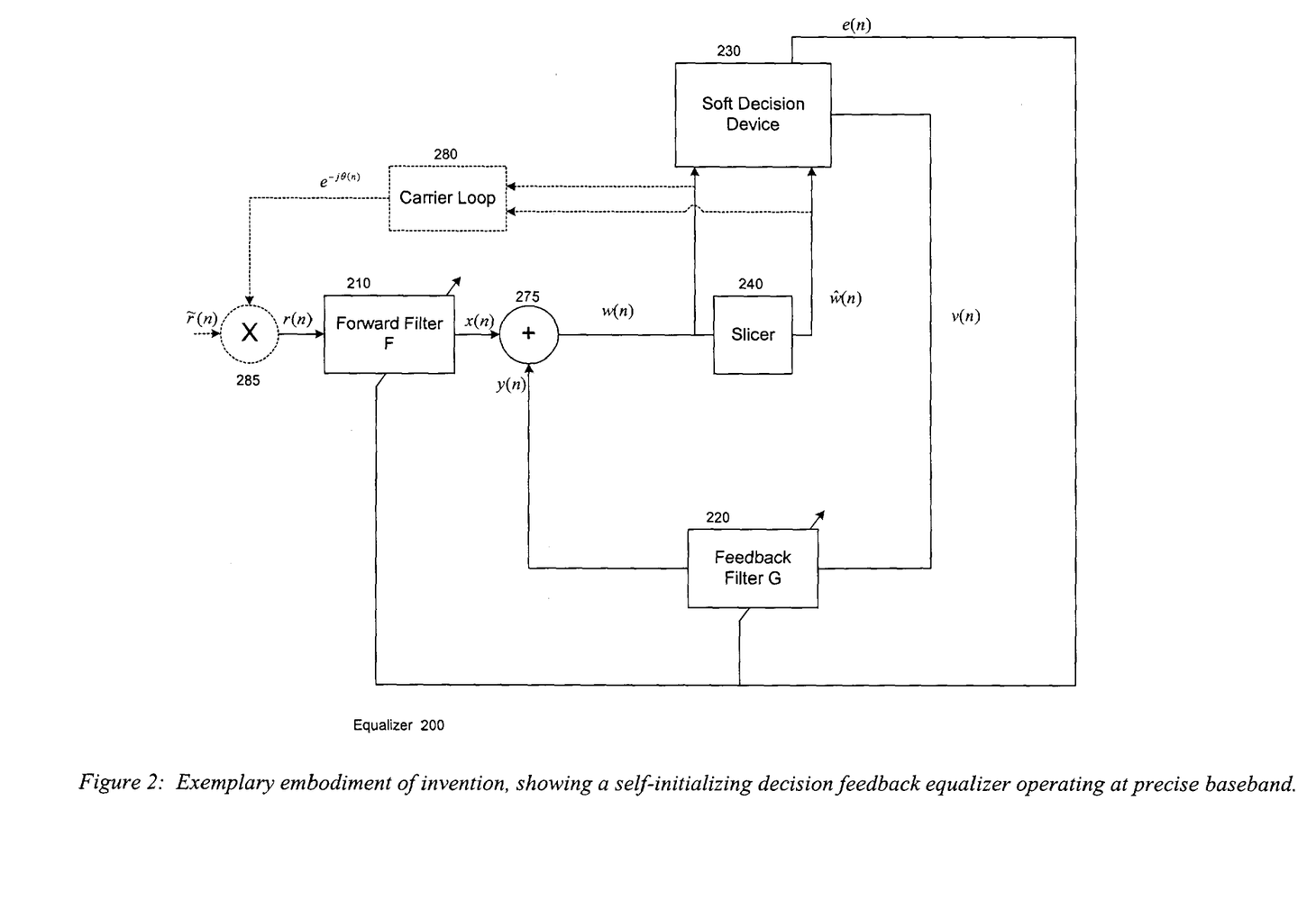
FIG. 2 shows an exemplary embodiment of the present invention, showing a self-initializing decision feedback equalizer operating at precise baseband.

FIG. 2 shows an exemplary embodiment of the present invention. An Equalizer 200 receives complex data $\tilde{r}(n)$ that is input to mixer 285. The mixer 285 also receives a signal from carrier recovery loop 280, $e^{-j\theta(n)}$, that is an estimate of the conjugate of the carrier offset. Methods of carrier recovery are well known to one skilled in the art, and may be found, for example, in chapter 16 of the text "Digital Communication" by E. A. Lee and D. G. Messerschmitt, Kluwer Academic Publishers, 1994, which is incorporated herein by reference. The carrier recovery loop 280 and mixer 285 are shown as dashed lines, to represent that translation to precise baseband is done prior to equalization, and may be done anywhere prior to equalization in the signal processing chain. For example, some systems embed pilot tones or pulses to aid synchronization, allowing translation to precise baseband in the receiver front end, prior to equalization. In this exemplary embodiment of the invention, the equalizer 200 operates on samples that have been translated to precise baseband.

The output of mixer 285 is a received signal, r(n), that is at precise baseband, and is input to forward filter 210. Forward filter 210 may operate at the baud rate or faster, in which case the equalizer is said to be fractionally-spaced, and exploits temporal diversity. Also, the forward filter 210 may receive multiple inputs, as from multiple antennae, to exploit spatial diversity. Temporal or spatial diversity uses a multi-channel forward filter. For simplicity, however, a single forward filter 210 is shown, and extension to a multi-channel model is understood by one skilled in the art.

Filtering

Forward filter 210 is a finite impulse response (FIR) filter, computing its output according to the convolution sum $$x(n)=f_0(n)r(n)+f_1(n)r(n-1)+f_2(n)r(n-2)+\ldots+f_{L_f-1}(n)r(n-L_f+1)$$

where r(n) is the sample sequence input to forward filter 210, x(n) is the output sample sequence of forward filter 210, $f_i$ are the forward filter coefficients (or parameters,) and $L_f$ is the number of forward filter coefficients. Note that the forward filter coefficients are also shown with time index n to indicate that the forward filter 210 is adaptive.

The feedback filter 220 is not multi-channel, and is a FIR filter that calculates its output according to the convolution sum $$y(n)=g_0(n)v(n)+g_1(n)v(n-1)+g_2(n)v(n-2)+\ldots+g_{L_g-1}(n)v(n-L_g+1)$$

where v(n) is the sample sequence input to feedback filter 220, y(n) is the output sample sequence of feedback filter 220, $g_i$ are the feedback filter coefficients (or parameters,) and $L_g$ is the number of feedback filter coefficients. Note that the feedback filter coefficients are also shown with time index n to indicate that the feedback filter 220 is adaptive. Though the feedback filter 220 is a FIR filter, it is embedded in a feedback loop, so that the equalizer has an overall impulse response that is infinite.

Adder 275 combines the outputs of forward filter 210 and feedback filter 220, x(n) and y(n), respectively, to form sample sequence w(n). Sample sequence w(n) is referred to as slicer inputs. The slicer inputs, w(n), are input to slicer 240. Slicer 240 is a nearest-element decision device that outputs a hard decision, $\hat{w}(n)$, corresponding to the source alphabet member with closest Euclidean distance to its input sample. The slicer input w(n) and the hard decisions, $\hat{w}(n)$, from slicer 240 are input to the Soft Decision Device 230.

Soft Decision Device

Figure 3:
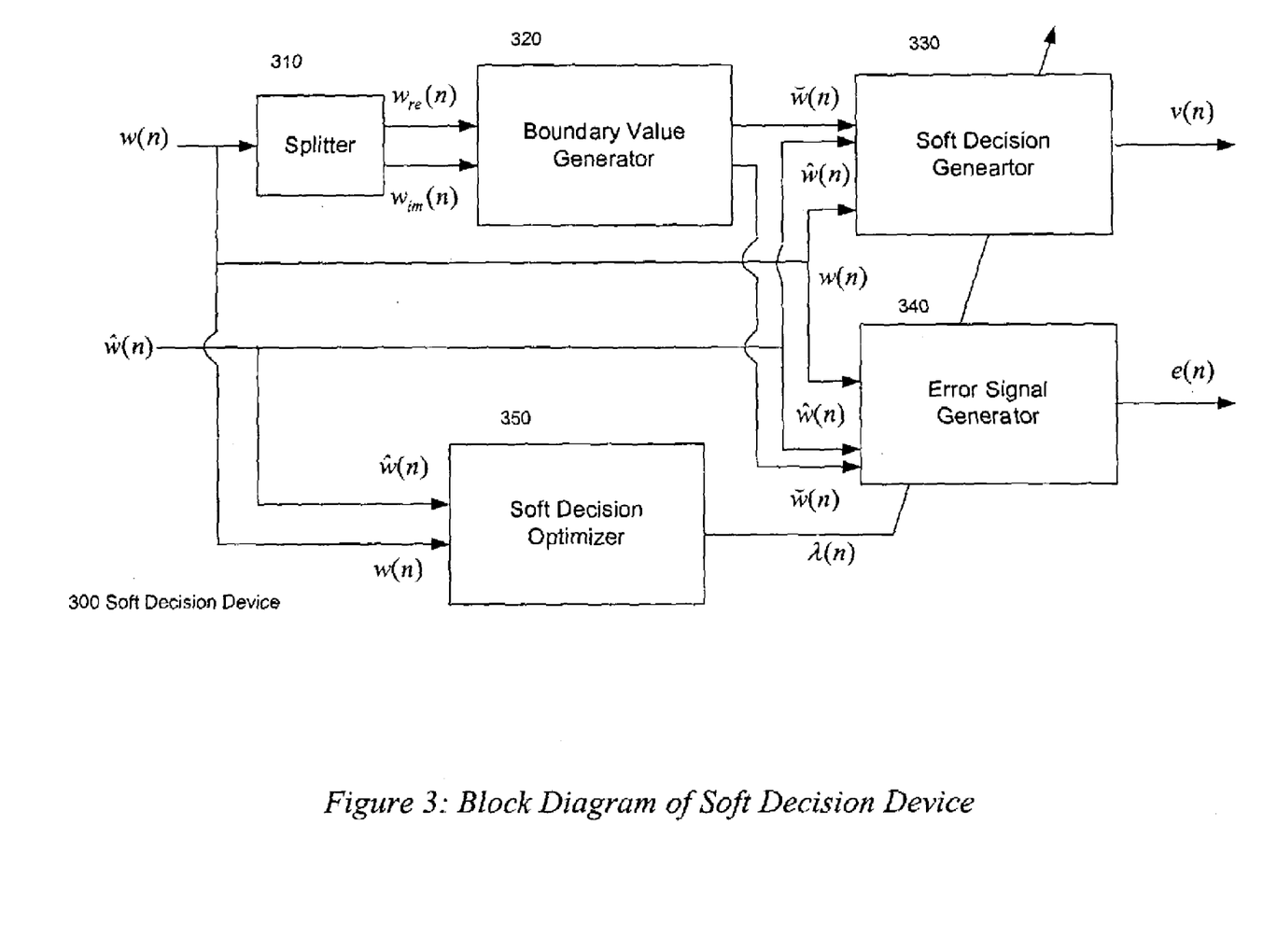
FIG. 3 describes the Soft Decision Device in the present invention.

FIG. 3 describes the Soft Decision Device in accordance with the present invention. The slicer input w(n) is splitted into real and imaginary components. For the real and imaginary parts of w(n), $w_{re}(n)$ and $w_{im}(n)$ respectively, the Boundary Value Generator 320 produces the nearest decision boundary values $\breve{w}_{re}(n)$ and $\breve{w}_{im}(n)$ by treating $w_{re}(n)$ and $w_{im}(n)$ as a Pulse Amplitude Modulated (PAM) signals, which belong to a alphabet set $$\{-(2M-1)\Gamma,\ldots,-3\Gamma,-\Gamma,3\Gamma,\ldots(2M-1)\Gamma\}$$

where the constellation unit $\Gamma$ and PAM level M are determined from the QAM level.

$$\breve{w} = \underset{2k\Gamma}{\operatorname{argmin}} |w - 2k\Gamma|,$$

for k=−M+1, . . . , M−1.

with |·| denoting absolute value, or magnitude. Remind that the hard decision of a PAM signal is defined by $$\hat{w} = \underset{(2k-1)\Gamma}{\operatorname{argmin}} |w - (2k-1)\Gamma|,$$

for k=−M+1, . . . , M−1.

Figure 4:
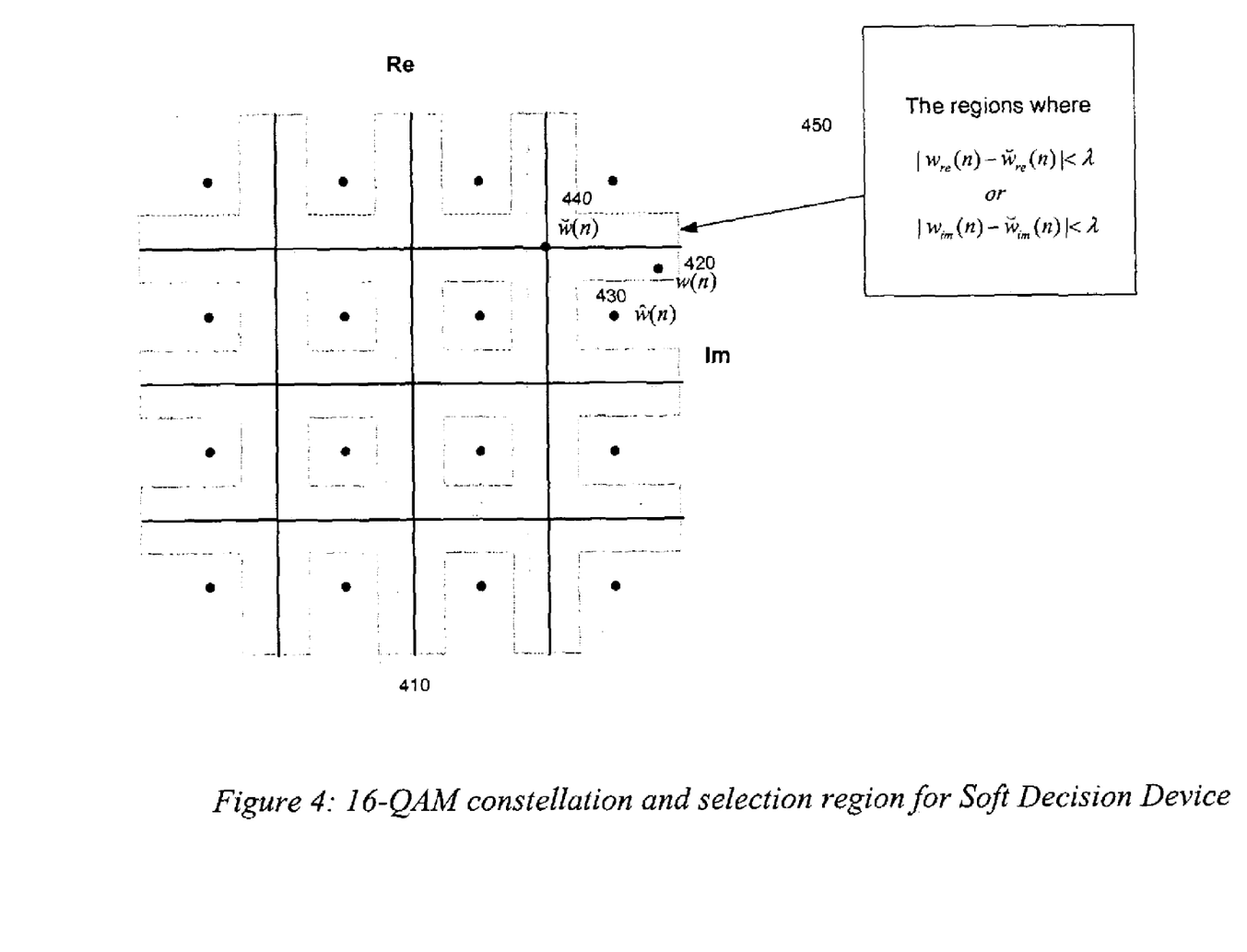
FIG. 4 shows a 16-QAM constellation selection regions for Soft Decision Device in the present invention.

FIG. 4 illustrates the relation among w(n) (420), $\hat{w}(n)$ (430), $\breve{w}_{re}(n)$ (440), and $\breve{w}_{im}(n)$ (440) for a 16-QAM constellation.

In FIG. 3 the Soft Decision Generator 330 generates the soft decision based on the comparison between the distance between the nearest boundary values from the slicer input, $|w_{re}(n)-\breve{w}_{re}(n)|$ and $|w_{im}(n)-\breve{w}_{im}(n)|$, and a decision reference parameter $\lambda(n)$, according to $$v(n) = \begin{cases} \dfrac{w(n)-\breve{w}(n)}{\lambda(n)} + \breve{w}(n) & \text{if } |w_{re}(n)-\breve{w}_{re}(n)| < \lambda(n) \text{ or } |w_{im}(n)-\breve{w}_{im}(n)| < \lambda(n) \\ \hat{w}(n) & \text{else} \end{cases}$$

where $\breve{w}(n)=\breve{w}_{re}+j\breve{w}_{im}$.

The soft decision device is made adaptive by adaptation of the decision reference parameter $\lambda(n)$. The decision reference parameter $\lambda(n)$ is initialized by $\lambda(0)=1$ and adjusted from 0 to 1 depending on the signal quality. The Soft Decision Optimizer 350 optimizes the decision reference parameter $\lambda(n)$. The decision reference parameter $\lambda(n)$ can be approximately optimized by setting $\lambda(n)=E|w(n)-\hat{w}(n)|^2/E|w(n)|^2$ (with $E\{\cdot\}$ denoting statistical expectation) and can be adjusted each symbol instance using the leakage integrator $$\lambda(n)=(1-\rho_\lambda)\cdot\lambda(n-1)+\rho_\lambda\cdot|w(n)-\hat{w}|^2/\Delta$$

where $\Delta$ is chosen to normalize $|w(n)-\hat{w}|^2$ (for example average signal power, $\Delta=E|w(n)|^2$) and $\rho_\lambda$ is the leakage term and is chosen less than or equal to one and greater than or equal to zero.

Alternatively, $\lambda(n)$ can be updated on a block by block base based on the block estimation of $E|w(n)-\hat{w}(n)|^2/E|w(n)|^2$, or using training signals instead of $\hat{w}(n)$ for the training periods. Furthermore, the combining weight $\lambda(n)$ may be compared to two thresholds, $T_U$ and $T_L$. If $\lambda(n)>T_U$, then $\lambda(n)$ is set to one; if $\lambda(n)<T_L$, then $\lambda(n)$ is set to zero Error Signal Generation and Coefficient Adaptation Adaptation of the forward filter 210 coefficients and feedback filter 220 coefficients uses a stochastic gradient descent update rule:

$$f_i(n+1)=f_i(n)-\mu_f\Phi^*(n)e(n)$$

$$g_i(n+1)=g_i(n)-\mu_g\phi^*(n)e(n)$$

where $(\cdot)^*$ represents complex conjugation, and $\mu_f$ and $\mu_g$ are small, positive stepsizes governing algorithm convergence rate, tracking capabilities and stochastic jitter. Using simplified updates, the data used in the adaptation equations are set to $\Phi(n)=r(n)$ and $\phi(n)=v(n)$. The baseband error term $e(n)$ that updates the forward filter 210 and feedback filter 220 at each baud instance is selected by Error Signal Generator 340 in Soft Decision Device 300 and is calculated according to $$e(n) = \begin{cases} e_1(n) & \text{if } |w_{re}(n)-\breve{w}_{re}(n)|<\lambda(n) \text{ or } |w_{im}(n)-\breve{w}_{im}(n)|<\lambda(n) \\ e_2(n) & \text{else} \end{cases}.$$

The preferred embodiment of the present invention uses a Constant Modulus Algorithm (CMA) error term of order $p=2$ (as described by Godard in "Self recovering equalization and carrier tracking in two-dimensional data communication systems") for $e_1(n)$ and a Decision-Directed LMS (DD-LMS) error term for $e_2(n)$. For example, CMA ad DD-LMS error terms may be calculated according to $$e_{cma} = \left(\frac{w(n)-\breve{w}(n)}{\lambda(n)}+\breve{w}(n)\right)\left(\left|\frac{w(n)-\breve{w}(n)}{\lambda(n)}+\breve{w}(n)\right|^2-\gamma\right)$$

$$e_{dd\text{-}lms}=w(n)-\hat{w}(n)$$

where $\gamma$ is a real scalar referred to as the CM dispersion constant or Godard radius, and is usually calculated as $\gamma=E\{|s(n)|^4\}/E\{|s(n)|^2\}$ for source sequence $s(n)$, (These error terms are said to be baseband, since they are derived from samples at precise baseband.)

The intuition behind this error term generation is that the slicer inputs near hard decision boundaries are treated less reliable signals than the slicer inputs near hard decision samples. The Error Signal Generator 340 separates the unreliable signals and reliable signals, and apply IIR adaptation for the unreliable signals after proper rescaling. For the reliable signals the conventional DD-LMS is applied.

Other choices of error terms may include CMA error terms of order other than $p=2$; those derived from the Bussgang class of cost functions, as described in chapter 2 of "Blind Deconvolution," Prentice Hall, written by S. Bellini, edited by S. Haykin, 1994; single-axis error terms which use real-part extraction, as described in a paper by A. Shah et al, entitled "Global convergence of a single-axis constant modulus algorithm," *Proceedings of the IEEE statistical signal and array processing workshop*, Pocono Manor, Pa., August, 2000; or error terms derived from other blind or non-blind criteria.

Setting $\Phi(n)=r(n)$ and $\phi(n)=v(n)$ in the above equations used to adapt forward filter 210 and feedback filter 220 coefficients is referred to as "simplified updates," since the step known as regressor filtering is omitted. True cost function minimization requires an extra stage of filtering for the regressor data of the forward filter 210 and the feedback filter 220 in the adaptation process, using the current equalizer coefficients. Such regressor filtering is typically omitted in practice due to implementation burden. Regressor filtering is described in Chapter 5 of "Theory and design of adaptive filters" by J. R. Treichler, C. R. Johnson, Jr., and M. G. Larimore, Prentice Hall, 2001. One skilled in the art would recognize how to modify the regressor data used in the adaptation equations above to incorporate the extra stage of regressor filtering.

Figure 5A:
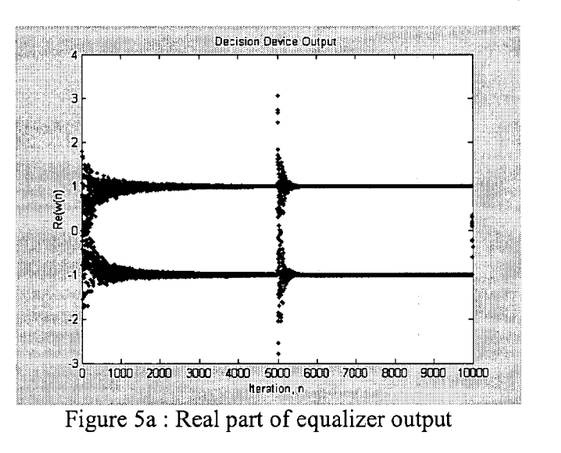
FIG. 5a shows the in-phase component of the equalizer output from a computer simulation of the preferred embodiment of the present invention.
Figure 5B:
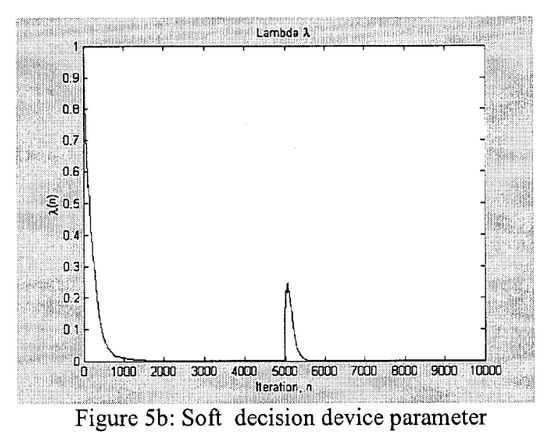
FIG. 5b shows the soft decision parameter $\lambda(n)$ trajectory from a computer simulation of the preferred embodiment of the present invention.

FIGS. 5a and 5b illustrate the equalizer output and soft decision reference parameter $\lambda(n)$ in operation from a computer simulation of the preferred embodiment of the present invention. The source signal is 4-QAM (QPSK) data passed through a closed-eye channel that has rapid time variation at the 5,000$^{th}$ baud sample. There are 10,000 baud samples, with adaptation of equalizer coefficients and decision reference parameter at the start of the simulation. The leakage value for Soft Decision Device optimization is $\rho_\lambda=0.01$. Thresholds for the combining weight are set to $T_U=1$ and $T_L=0$.

FIG. 5a shows the real part of slicer inputs converging to correct decisions as adaptation is processed. Sudden dispersion at the 5,000$^{th}$ baud sample is due to sudden change of the multipath channel.

FIG. 5b shows the trajectory of decision reference parameter $\lambda(n)$, initialized to unity, and converging towards zero when channel is static, and optimizing the adaptation and soft decision device when channel is varying.

Figure 5C:
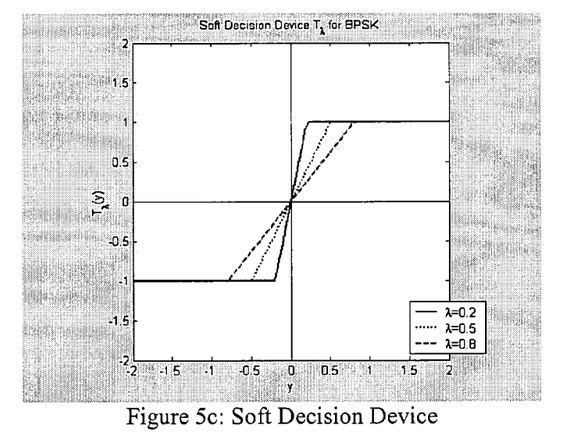
FIG. 5c illustrates the input-output relation of the Soft Decision Device for a given $\lambda(n)$ and constellation.

FIG. 5c draws the soft decision device as a function of slicer input for various choice of decision reference parameter $\lambda(n)$ in this simulation. For $\lambda(n)=0$ the soft decision device agrees with hard limiter and DFE is operating with DD-LMS algorithm. As $\lambda(n)$ increases the region of unreliable signals are increased too and DFE is operating with the conventional CMA in that region.

Passband/Passband Equalization

An alternative embodiment of the present invention is shown in FIG. 5, in which the equalizer 500 operates in the passband; that is, not at precise baseband. Equalizer 500 is similar to equalizer 200 in FIG. 2, so only the differences in equalizer 500 of FIG. 5 are described.

Forward filter 510 and feedback filter 520 produce data by convolution sums in an analogous manner to that described for the exemplary embodiment in FIG. 2, yielding passband signals x(n) and y(n), respectively. The outputs of forward filter 510 and feedback filter 520 are combined in adder 590, yielding the passband sample ŵ(n). This sample is translated to precise baseband (or de-rotated) slicer input w(n) in multiplier 555 by multiplication with the conjugate of the carrier offset, $e^{-j\theta(n)}$, provided by carrier recovery loop 585. The slicer 540 is a nearest-element decision device that outputs a hard decision, ŵ(n), corresponding to the source alphabet member with closest Euclidean distance to its input sample. The slicer input and hard decision samples are input to the Soft Decision Device and the soft decision v(n) is translated back to the passband in multiplier 560 by multiplication with the carrier offset $e^{j\theta(n)}$, provided by the carrier recovery loop 585.

Though soft decision is made actually in baseband, equalizer adaptation must use an error term that is in the passband. The translation rules between passband and baseband error terms are given by:

$$e_{dd-lms}^{passband} = e_{dd-lms} \cdot e^{j\theta(n)}$$

$$e_{CMA}^{passband} = e_{CMA} \cdot e^{j\theta(n)}$$

Since both forward filter 510 and feedback filter 520 operate in the passband, they are updated with passband error terms.

Passband/Baseband Equalization

Figure 6:
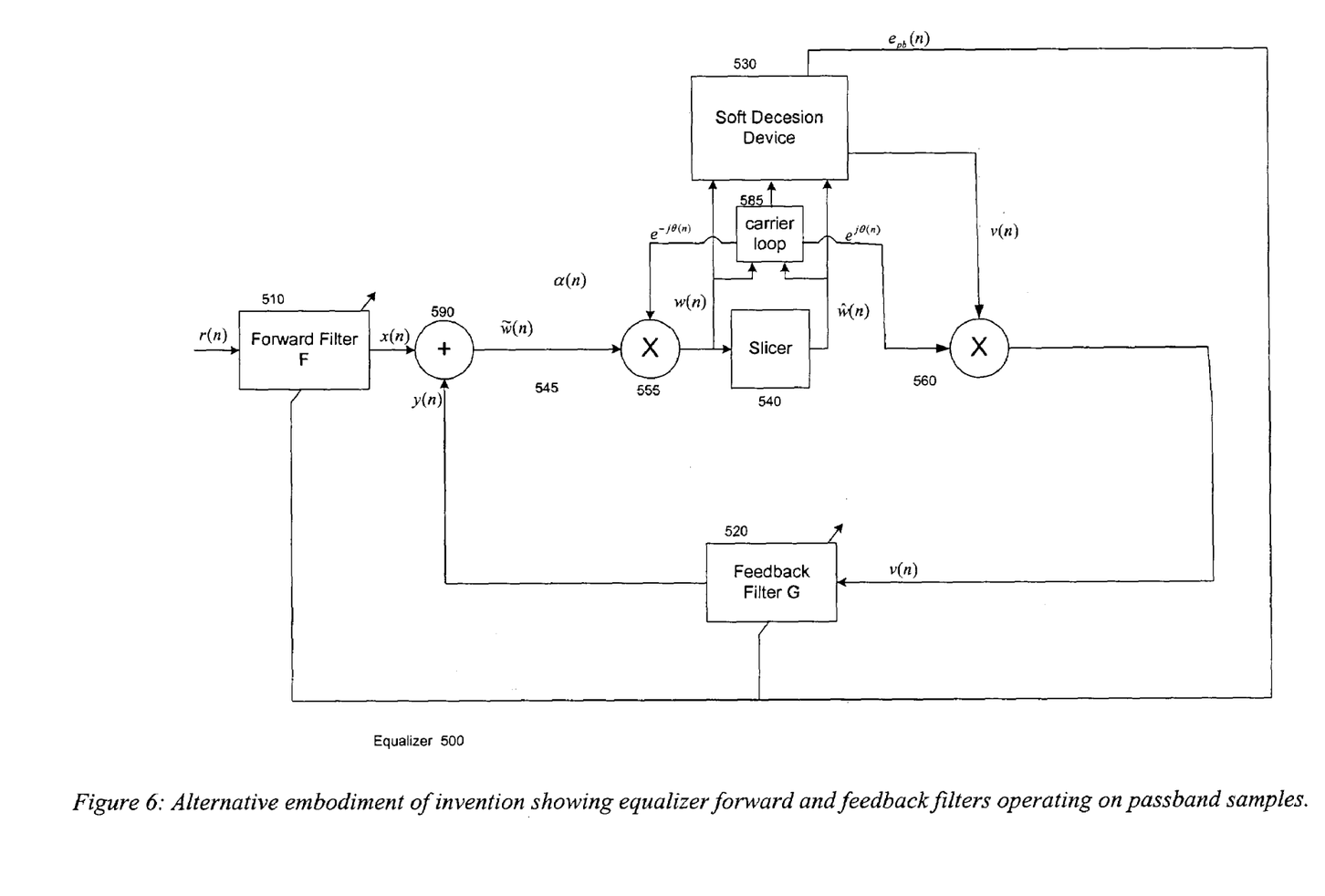
FIG. 6 shows an alternative embodiment of the present invention, with equalizer forward and feedback filters operating on passband samples.
Figure 7:
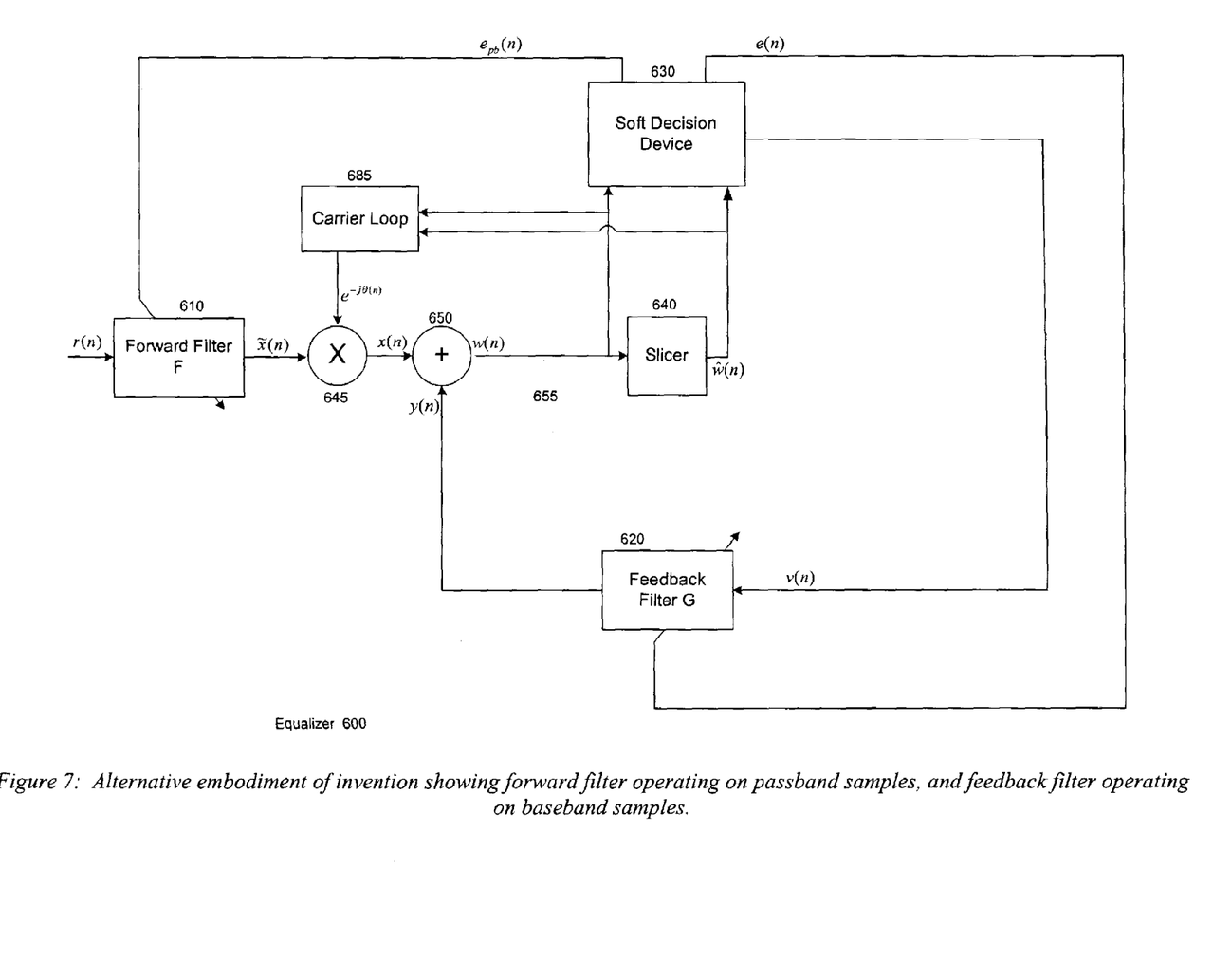
FIG. 7 shows an alternative embodiment of the present invention, with equalizer forward filter operating on passband samples, and equalizer feedback filter operating on baseband samples.

FIG. 6 shows equalizer 600, an alternative embodiment of the present invention, in which the forward filter 610 operates on passband data, while the feedback filter 650, and all processing after multiplier 645, operate at precise baseband. Forward filter 610 operates on received passband data r(n) and calculates output $x_{pb}(n)$ via the convolution sum discussed for the filtering process of equalizer 200 in FIG. 2.

Multiplier 645 translates the output of forward filter 610 to precise baseband by multiplication with the conjugate of the carrier offset estimate, $e^{-j\theta(n)}$, provided by carrier recovery loop 685. The remainder of the equalizer 600 operates analogously to the equalizer 200 in FIG. 2, except that the equalizer control module 630 receives also the carrier offset estimate from carrier recovery loop 685 to produce a passband error term, $e_{pb}(n)$, as well as a baseband error term, e(n). Feedback filter 620 operates on baseband data, and thus is adapted with the baseband error terms described for operation of equalizer 200 in FIG. 2. However, since forward filter 610 in FIG. 6 processes passband data, it is adapted by passband error terms that are generated by rotating the baseband error term with the current offset of the carrier recovery estimate, $e^{j\theta(n)}$.

One skilled in the art would understand that the equations described herein may include scaling, change of sign, or similar constant modifications that are not shown for simplicity. One skilled in the art would realize that such modifications can be readily determined or derived for the particular implementation. Thus, the described equations may be subject to such modifications, and are not limited to the exact forms presented herein.

The present invention has been described using Quadrature Amplitude Modulation (QAM) signals with complex signal processing, unless specifically noted. However, one skilled in the art would realize that the techniques described herein may be applied to a receiver processing Phase-Shift Keyed (PSK), Pulse Amplitude Modulation (PAM), or other signals.

As would be apparent to one skilled in the art, the various functions of equalization, signal combining, and automatic gain control may be implemented with circuit elements or may also be implemented in the digital domain as processing steps in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for operating forward and feedback filters in a communications receiver having a decision feedback equalizer, said communications receiver having a decision feedback equalizer, said communications receiver responsive to a received signal to form slicer input samples and hard decision samples corresponding to said slicer output samples, said method comprising:

non-linearly combining said slicer input samples and said hard decision samples to form a soft decision samples in a soft decision device; and the said soft decision device being adaptively adjusted to control contributions of said slicer input samples and said hard decision samples to form said soft decision samples; and said soft decision device generating error signals to adjust said forward and feedback filters; and operating said forward and feedback filters by coupling a composite decision samples to said feedback filter and by adapting said forward and feedback filters with said error signals.

2. The method of claim 1, wherein said decision feedback equalizer operates in passband.

3. The method of claim 1, wherein said feedback filter operates in baseband.

* * * * *